United States Patent [19]

Arai et al.

[11] Patent Number: 4,493,977
[45] Date of Patent: Jan. 15, 1985

[54] METHOD FOR HEATING SEMICONDUCTOR WAFERS BY A LIGHT-RADIANT HEATING FURNACE

[75] Inventors: Tetsuji Arai, Kobe; Yoshiki Mimura; Hiroshi Shimizu, both of Yokohama, all of Japan

[73] Assignee: Ushio Denki Kabushiki Kaisha, Tokyo, Japan

[21] Appl. No.: 480,014

[22] Filed: Mar. 29, 1983

[30] Foreign Application Priority Data

Sep. 30, 1982 [JP] Japan ................... 57-169889

[51] Int. Cl.³ .............................................. H05B 1/00
[52] U.S. Cl. ..................... 219/411; 219/405; 219/388; 219/354; 118/725; 432/225
[58] Field of Search ............... 219/405, 411, 354, 390, 219/388, 343, 349, 85 BA, 85 BM; 432/148, 225, 226; 118/50.1, 728, 724, 725

[56] References Cited

U.S. PATENT DOCUMENTS

| | | | |
|---|---|---|---|
| 3,539,759 | 11/1970 | Spiro | 118/725 |
| 3,591,767 | 7/1971 | Mudie | 219/354 |
| 3,609,295 | 9/1971 | Bielefeldt | 219/388 |
| 3,760,154 | 9/1973 | Konger | 219/354 |
| 3,836,751 | 9/1974 | Anderson | 219/354 |
| 4,101,759 | 7/1978 | Anthony | 219/411 |
| 4,223,048 | 9/1980 | Engle | 118/728 |

Primary Examiner—Clifford C. Shaw
Assistant Examiner—Teresa J. Walberg
Attorney, Agent, or Firm—Ziems, Walter & Shannon

[57] ABSTRACT

Disclosed herein is a method for operating a light-radiant heating furnace which includes a main heater capable of irradiating light onto an object to heat it up and a subsidiary heater adapted principally to additionally heat a peripheral portion of said object, which method includes actuating said main heater and subsidiary heater repeated in accordance with their respective actuation curves, which have in advance been prepared, in synchronization with intermittent transportation of objects into said light-radiant heating furnace. The light-radiant heating furnace permits a uniform heat treatment of objects always with high efficiency but without development of slip line or warping, even when they are semiconductor wafers and are heated up in short time periods.

5 Claims, 7 Drawing Figures

METHOD FOR HEATING SEMICONDUCTOR WAFERS BY A LIGHT-RADIANT HEATING FURNACE

BACKGROUND OF THE INVENTION

1 Field of the Invention

This invention relates to a method for operating a light-radiant heating furnace which uses incandescent lamps as its light-radiant source.

2 Description of the Prior Art

Among a variety of apparatus adapted to carry out heat treatments therein, light-radiant heating furnaces in which light radiated from an incandescent lamp or lamps is irradiated onto objects or materials to be treated (hereinafter referred to merely as "objects") for their heat treatment have the following merits:

(1) Owing to an extremely small heat capacity of an incandescent lamp per se, it is possible to raise or lower the heating temperature promptly;

(2) The heating temperature can be easily controlled by controlling the electric power to be fed to the incandescent lamp;

(3) Since they feature indirect heating by virtue of light radiated from their incandescent lamps which are not brought in contact with the objects, there is little danger of contaminating objects under heat treatment;

(4) They enjoy less energy consumption because full-radiation-state operation of the lamps in feasible a short time after turning the lamps on and the energy efficiencies of the lamps are high; and (5) They are relatively small in size and inexpensive compared with conventional resistive furnaces and high-frequency heating furnaces.

Such light-radiant heating furnaces have been used for the heat treatment and drying of steel materials and the like and the molding of plastics as well as in thermal characteristics testing apparatus and the like. Use of light-radiant heating furnaces has particularly recently, been contemplated to replace the conventionally-employed resistive furnaces and high-frequency heating furnaces for carrying out certain semiconductor fabrication processes which require heating, for example, diffusion processes of dopant atoms, chemical vapor deposition processes, annealing processes for healing crystal defects in ionimplanted layers, thermal treatment processes for activation, and thermal processes for nitrifying or oxidizing the surfaces of silicon wafers. As reasons for the above move may be mentioned the incapability of conventional heating furnaces to heat heating larger-sized objects uniformly, thereby failing to meet the recent trend toward larger semiconductor wafer size, in addition to the advantages of light-radiant heating furnaces that objects under heat treatment are free from contamination, their electric properties are not deleteriously affected and the light-radiant heating furnaces require less power consumption.

In such a light-radiant heating furnace, there is provided a suitable transportation system for transporting objects intermittently. By the transportation system, each object is transported into the light-radiant heating furnace and then subjected to a heat treatment therein. Namely, each object is held on a carrier of the transportation system at the loading station for the objects. Thereafter, the carrier is caused to move into the light-radiant heating furnace in which the object held on the carrier is exposed to light radiated from incandescent lamps, which make up a light-radiant source, so as to carry out the heat treatment. Then, the carrier is again caused to move to the unloading station of treated objects, which unloading station is located outside the light-radiant heating furnace. At the unloading station, the thus-treated object is unloaded from the carrier, thereby completing a single cycle of the heat treatment process. The carrier is thereafter moved again to the loading station and loaded with the next object to be treated. Then, the heat treatment process of the next object is carried out in the same manner.

Heat treatment of objects is generally carried out in such a manner as mentioned above. Depending on the kinds or types of objects to be treated, their heating temperatures and heating time periods must be strictly controlled.

For example, the ion implantation process has recently been finding actual utility as an effective method for introducing dopant atoms into a semiconductor wafer (hereinafter referred to as "wafer") since it is possible to control accurately the concentration levels of dopant atoms and the depths of resulting junctions. In the ion implantation process, it is necessary, subsequent to implantation, to subject each wafer to a heat treatment at about 1000° C. or higher. This heat treatment must be carried out accurately in a short time period so as to prevent the concentration distribution of the implanted dopant atoms in the depthwise direction of the wafer from changing due to thermal diffusion. Furthermore, there is an outstanding demand for the establishment of a high-speed heating and cooling cycle for wafers in order to improve their productivity.

It has however been found that, when a wafer, for example, a wafer of a single crystal of silicon is heated to 1000° C. or higher in a few seconds, a damage called "slip line" is developed in the wafer because of a difference in the rising velocity of temperature between its peripheral portion and its central portion, in other words, due to a non-uniform temperature rise therebetween. The thickness of a wafer is generally very small, namely, of a level of about 0.5 mm or so and its thicknesswise temperature distribution is thus rendered substantially uniform in a very short time period of a level of $10^{-3}$ second or so. Accordingly, such a damage as slip line may be possibly avoided if the temperature distribution on the surface of each wafer is rendered uniform. However, it is very difficult to prevent the development of such a damage as slip line in an actual process even if the surface of each wafer is exposed to radiated light having a uniform irradiation energy density, because more heat radiates from the peripheral portion of the wafer than its central portion and the peripheral portion thus remains cooler than the central portion Furthermore, in repeated heating processes of sensitive objects such as silicon wafers, it is necessary to subject each object to a heat treatment under the same conditions. If each object is subjected to the treatment under different conditions, the treated objects would have non-uniform characteristics due to the differences of the heating conditions, even when the differences are small.

SUMMARY OF THE INVENTION

The present invention has been completed with the above-described state of the art in view. An object of this invention is accordingly to provide a method for operating a light-radiant heating furnace equipped with incandescent lamps as its light-radiant source, which method is capable of performing a heat treatment—which features a reduced temperature difference between the central portion of each object and its peripheral portion—repeatedly, always under the same conditions.

In one aspect of this invention, there is thus provided a method for operating a light-radiant heating furnace which includes a main heater capable of irradiating light onto an object to heat it up and a subsidiary heater adapted principally to additionally heat a peripheral portion of said object, which method comprises actuating said main heater and subsidiary heater repeatedly in accordance with their respective actuation curves, which have been prepared in advance, in synchronization with intermittent transportation of objects into said light-radiant heating furnace.

The operation method of a light-radiant heating furnace according to this invention permits a uniform heat treatment of all objects with high efficiency but without development of "slip line" or "warping", even when the objects are semiconductor wafers and are heated up in short time periods, since they are always heated uniformly by minimizing the difference in heating temperature between the central portion and the peripheral portion of each object.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENT

One embodiment of this invention will hereinafter be described with reference to the accompanying drawings.

Figure 1:
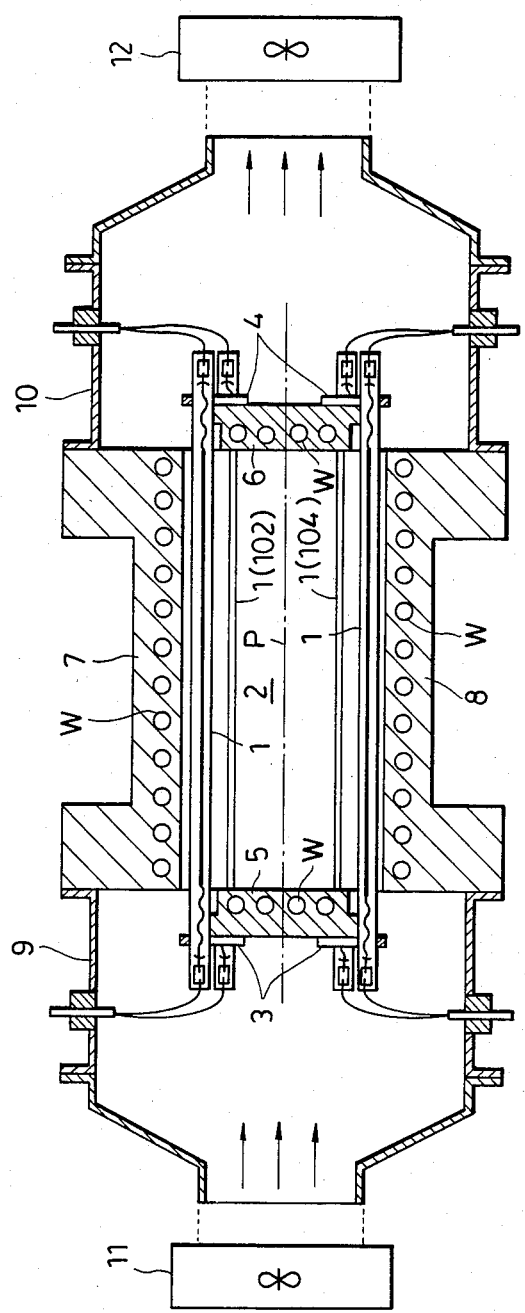
FIG. 1 is a vertical cross-sectional front elevation of one embodiment of a main heater of the light-radiant heating furnace which is operated according to the method of this invention.
Figure 2:
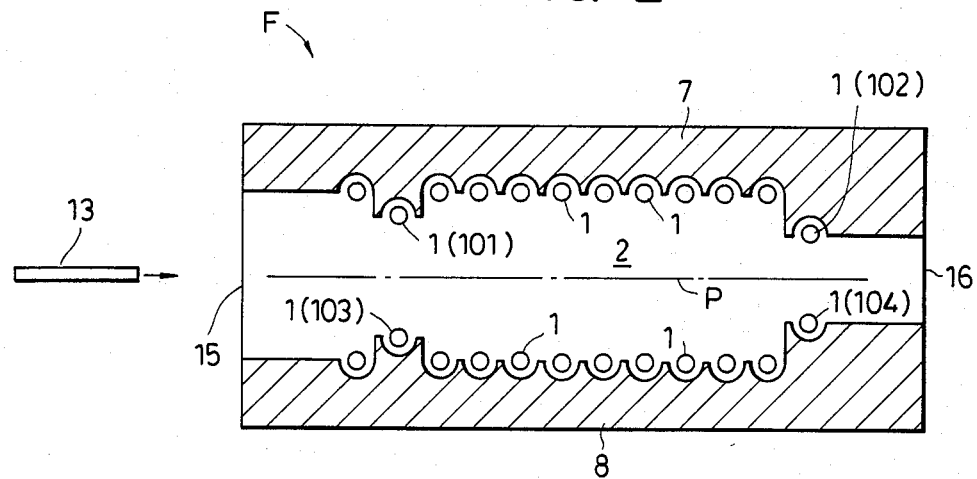
FIG. 2 is a vertical cross-sectional side elevation of the main heater of FIG. 1.

FIGS. 1 and 2 illustrate an example of the light-radiant heating furnace F which may be operated in the practice of the method according to the present invention. Numeral 1 indicates tubular incandescent halogen lamps of 1.5 KW power consumption per lamp, which are arranged to extend in upper and lower parts of an irradiation space 2 in the same direction (in the left-to-right or right-to-left direction in FIG. 1). Twelve incandescent halogen lamps 1 are provided in parallel in each of the upper and lower parts, thereby forming a plane light source. Among the 12 incandescent lamps, incandescent lamps 101, 102, 103 and 104, which are located adjacent to both sides of the plane light source, are dispased close to a level P on which an object to be treated is placed in the irradiation space 2. By the above-described plane light sources is constructed a main heater whose total power consumption reaches 36 KW. A single crystal silicon wafer 21 (see FIG. 3) having a diameter of 4 inches and positioned on the level P can be heated by the main heater to have a surface temperature of about 1250° C. at a central portion 21a thereof. Numerals 3 and 4 indicate support members for supporting the incandescent lamps 1. The support members 3, 4 are fixedly secured on respective side mirrors 5, 6 which will be described later in the present specification.

Designated by numerals 7, 8 are main mirrors provided behind their corresponding incandescent lamps 1. The side mirrors 5, 6 are provided in such a way that they cover up both ends of the irradiation space 2. Through the interior of each of the main mirrors 7, 8 and side mirrors 5, 6, there are formed water channels W for causing cooling water to pass therethrough.

Numerals 9, 10 indicate air duct members coupled to both longitudinal ends of the main mirrors 7, 8. One of the air duct members, i.e., the air duct member 9, is connected to an air blower 11, whereas the other air duct member 10 is communicated with an exhaust fan 12. As shown by arrows in FIG. 1, cooling air is fed from the air blower 11 and is caused to flow along the sealed tubes of the incandescent lamps 1 while cooling the sealed tubes. Finally, it reaches the exhaust fan 12. Designated at numeral 13 is a carrier of a transportation system. Each object is transported into the irradiation space 2 of the light-radiant heating furnace F by means of the carrier 13.

Figure 3:
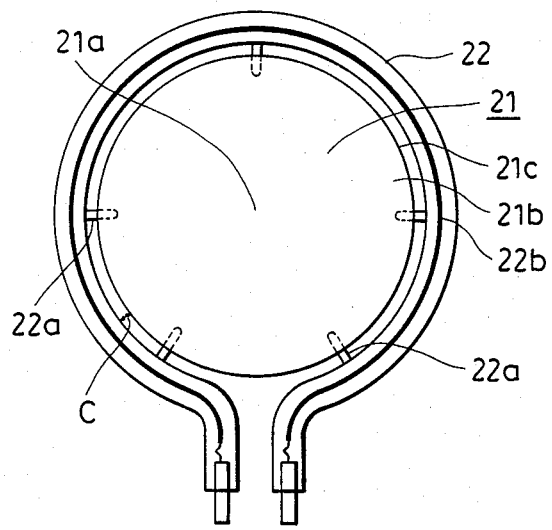
FIG. 3 is a schematic top plan view of one embodiment of a subsidiary heater which also serves as a carrier with a wafer held thereon for heat treatment.
Figure 4:
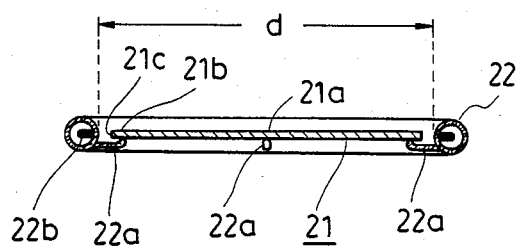
FIG. 4 is a vertical cross-sectional front elevation of the subsidiary heater and the wafer of FIG. 3.

FIG. 3 is a top plan view showing a wafer 21 held on a subsidiary heater 22, which also serves as the carrier, for subjecting the wafer 21 to a heat treatment. FIG. 4 is a vertical cross-sectional front elevation of the same subsidiary heater and wafer. The wafer 21 is 4 inches across and is made of single crystal silicon containing boron atoms introduced therein by the ion implantation process.

The subsidiary heater 22 comprises, for example, an elongated halogen or infrared lamp having a sealed tube made of silica glass. The lamp is internally provided with a filament 22b and is formed into a ring-like shape so as to surround the periphery 21c of the wafer 21. The lamp is equipped at several locations with quartz hooks 22a which support the wafer 21 thereon. Since the inner diameter d of the ring-shaped lamp is about 11 cm or so, the clearance c between the wafer 21 and the lamp is approximately 4 mm or so. When the lamp is kept on with the power consumption of about 920 W so as to additionally heat the circumferential portion 21b of the wafer 21 upon heating the wafer by means of application of light radiated from the main heater, the surface temperature of the central portion 21a is raised to 1250° C. while the peripheral portion 21b is heated to 1255° C. or so. Although the surface temperature becomes somewhat higher at the peripheral portion 21b, the wafer can be heat-treated without developing any damage such as slip line. In contrast, the temperature at the peripheral portion 21b will not exceed about 1120° C. and the development of slip line will be observed if the heating should be effected solely by the light radiated from the main heater without additional heating by the subsidiary heater 22. The occurrence of such damage as slip line can be avoided by additionally heating the peripheral portion 21b of the wafer 21 with the subsidiary heater 22 provided along the peripheral portion 21b so as to compensate for a temperature drop at the peripheral portion 21b due to radiation of heat therefrom, thus minimizing the temperature difference between the central portion and the peripheral portion and making the temperature of the wafer uniform at the entire surface thereof.

Figure 5:
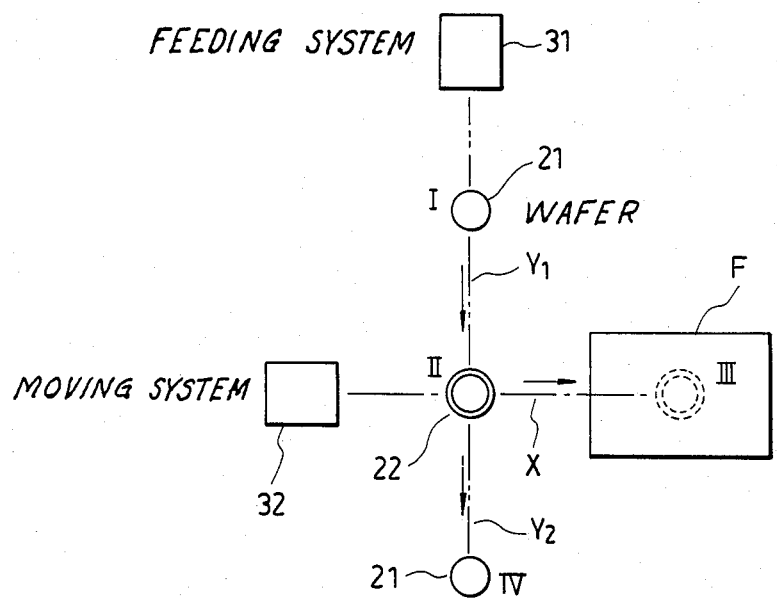
FIG. 5 is a flow sheet showing one embodiment of the transportation system for objects.

FIG. 5 illustrates the outline of a routine of the transportation system for heat-treating the semiconductor wafer 21 in the light-radiant heating furnace. Untreated wafers 21 are placed at a waiting station I. One of the untreated wafers is then fed by a feeding system 31 along a feeding path $Y_1$ from the waiting station I and loaded on the subsidiary heater 22, which also serves as a carrier, at the loading station II. The subsidiary heater 22 is then delivered by a moving system 32, along a moving path X, through one of the openings 15,16 of the light-radiant heating furnace, i.e., the opening 15 (see, FIG. 2), to a treatment station III in the light-radiant heating furnace F, thereby positioning the wafer 21 on the level P in the irradiation space 2. In this state, the subsidiary heater 22 is held at a standstill for a predetermined time period to conduct the heat treatment of the wafer 21. Thereafter, the subsidiary heater 22 is pulled backward along the moving path X to an unloading station which is located at the same position as the loading position II, where the heat-treated wafer is ejected by an ejection system (not shown) along an ejection path $Y_2$, to a discharge station IV. Thus, the heat treatment of a wafer has been completed and the same process is then repeated. Since conventionally-known feeding systems, moving system and ejection system may be employed as the feeding system 31, moving system 32 and ejection system, their detailed description is omitted in the present specification.

Although the subsidiary heater 22 is also adapted as the carrier in the above embodiment, it may be possible to provide a fixed subsidiary heater at the treatment station III in the light-radiant heating furnace F and to feed each wafer to the treatment station III by an independent carrier so that the wafer can be heated by the main heater and subsidiary heater at the treatment station III.

As described above, a process of transporting a wafer along a fixed transportation path in accordance with a predetermined time program, including holding the wafer for a certain constant residence time period in the light-radiant heating furnace F, is repeated. In synchronization with transportation of a wafer into the light-radiant heating furnace in each process, the main heater, more specifically, the halogen lamps 1, as well as the subsidiary heater 22 of the light-radiant heating furnace F are controlled so that they are actuated in accordance with their respective actuation curves which have been prepared in advance. The wafer is thus heated by the thus-actuated main heater and subsidiary heater.

Figure 6:
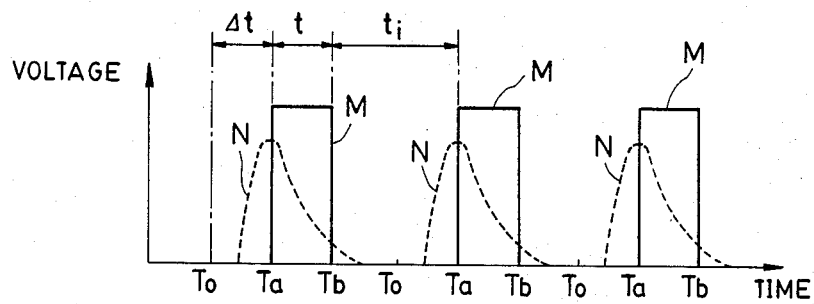
FIG. 6 illustrates diagrammatically an example of an actuation curve for the main heater.
Figure 7:
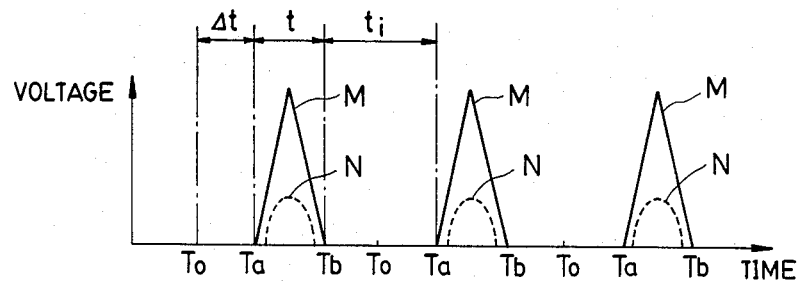
FIG. 7 is a diagrammatic illustration of an example of an actuation curve for the subsidiary heater.

The actuation curves, for example, the actuation curve for the main heater, may be represented by a curve M which shows the voltage to be applied to the main heater as a function of time. As examples of such actuation curves may be mentioned a square-wave and triangle-wave of solid lines which are shown respectively in FIGS. 6 and 7, in which Ta and Tb mean respectively the initial time points and the final time points in each heat treatment process. The time interval t from the initial time point Ta to the final time point Tb of each of the actuation curves M is determined by a time period required for the heat treatment of each object. In each heat treatment process, the halogen lamps 1 of the main heater are kept on by a voltage varying along the same actuation curve M. Broken lines, on the other hand, show actuation curves N of the voltage to be applied to the subsidiary heater in each of the heat treatment processes. The actuation curve N for the subsidiary heater somewhat precedes the corresponding actuation curve M for the main heater in FIG. 6. In FIG. 7, both actuation curves M and N are almost concurrent with each other. Specific waveforms of both actuation curves M, N and their combination may be suitably selected in various ways, besides those illustrated by way of example in FIGS. 6 and 7.

The wafers are transported intermittently into the light-radiant heating furnace as mentioned previously. Such transportation of each wafer is synchronized, in each heat treatment process, with the actuation of the main heater by setting the initial time point Ta of the actuation curve M of the main heater at a time point which is delayed by a constant time period $\Delta t$ from the standard time point To pertaining to the transportation of the wafer into the light-radiant heating furnace F. Here, the standard time point To is not limited to any specific time point so long as it is set at the same time point in each heat treatment process. For example, it may be possible to choose, as the standard time point To, the time point on which each wafer is supported on the carrier, the time point on which the carrier starts its movement toward the light-radiant heating furnace F, the time point on which the carrier passes through a specific point on the moving path X, or the like. Therefore, $\Delta t$ may be 0 (zero). Since the initial time point of the actuation curve N for the subsidiary heater is invariably co-related in time with the initial time point of the actuation curve M for the main heater, the former has a constant relationship in time with the standard time point To.

If the time interval of supply of wafers from the waiting station I is variable, it would be necessary to detect that each wafer passes through a specific location on the moving path $Y_1$ or X of wafers in order to determine the standard time point. However, when wafers are supplied with a constant time interval, the heat treatment of the wafers by means of the main heater and subsidiary heater is repeated in such a way that the time interval $t_i$ between the final time point Tb of a heat treatment process and the initial time point Ta of its subsequent heat treatment process on the actuation curves M for the main heater becomes constant. Within this time interval $t_i$, the transportation of a heat-treated wafer from the light-radiant heating furnace and its ejection, as well as the supply of a fresh wafer and its transportation into the light-radiant heating furnace, are carried out.

Any conventionally-known control means may be used to control the main heater and subsidiary heater in such a manner as described above.

According to the above-described operation method, the main heater and subsidiary heater are always actuated in accordance with their respective actuation curves, which have been prepared, in advance in the heat treatment process of each object. Accordingly, it is possible to make the conditions of light irradiation in the light-radiant heating furnace absolutely identical in each of the repeated heat treatment processes. Furthermore, for each object, it is also feasible to make the effect of heat transfer due to heat conduction and convection in the light-radiant heating furnace uniform. The heat treatment of each object can thus be carried out always under the same conditions. As a result, a highly-reliable heat treatment can be effected, leading to the provision of heat-treated objects having uniform characteristics.

Having now fully described the invention, it will be apparent to one of ordinary skill in the art that many changes and modifications can be made thereto without departing from the spirit or scope of the invention as set forth herein.

What is claimed is:

1. A method for heating semiconductor wafers by a light-radiant heating furnace wherein the light-radiant heating furnace includes a main heater and a subsidiary heater, said main heater comprising tubular lamps arranged substantially in a plane so as to form a plane light source unit which is capable of irradiating light onto a semiconductor wafer transported and placed in the light-radiant heating furance to heat mainly a central major part thereof, and said subsidiary heater having a ring shape which extends along a peripheral portion of the semiconductor wafer to heat principally the peripheral portion, the method comprising determining actuation curves for said main heater and said subsidiary heater, and actuating said main heater and said subsidiary heater repeatedly in accordance with their respective actuation curves in synchronization with intermittent transportation of the semiconductor wafers into said light-radiant heating furnace.

2. A method as claimed in claim 1, wherein said main heater is constructed of halogen lamps.

3. A method as claimed in claim 1, wherein said subsidiary heater serves as a carrier which supports and transports each of said semiconductor wafers into said light-radiant heating furnace.

4. A method as claimed in claim 1, wherein said main heater is actuated at an initial actuation time point with respect to the transportation of each semiconductor wafer into said light-radiant heating furnace, and said subsidiary heater is actuated at an initial actuation time point with respect to the transportation of each semiconductor wafer into said light-radiant heating furnace, and the time relationship between the initial actuation time point of the main heater and the initial actuation time point of the subsidiary heater is constant for all of said semiconductor wafers.

5. A method for heating semiconductor wafers comprising:
providing a light-radiant heating furnace including a main heater for heating mainly a central major part of each semiconductor wafer, said main heater having tubular lamps arranged substantially in a phone so as to define a plane light source unit, and a subsidiary heater for heating principally a peripheral portion of each semiconductor wafer, said subsidiary heater having a ring shape extending along said peripheral portion;
determining actuation curves of electric potential as a function of time for said main heater and said subsidiary heater, respectively;
intermittently transporting the semiconductor wafers into said light-radiant heating furnace; and
actuating said main heater to heat mainly the central major part of each semiconductor wafer and said subsidiary heater to heat principally the peripheral portion of each semiconductor wafer repeatedly in accordance with their respective actuation curves in synchronization with said intermittent transporting of the semiconductor wafers into said light-radiant heating furnace.

* * * * *

UNITED STATES PATENT AND TRADEMARK OFFICE
CERTIFICATE OF CORRECTION

PATENT NO. : 4,493,977
DATED : January 15, 1985
INVENTOR(S) : Arai et al.

It is certified that error appears in the above—identified patent and that said Letters Patent is hereby corrected as shown below:

Column 1, line 29, "in" should be --is--;

Column 3, line 46, "far" should be --for--;

Column 4, line 2, "dispased" should be --disposed--;

Column 5, line 33, "system" (first occurrence), should be "systems"; and

Column 8, claim 5, line 18, "phone" should be --plane--.

Signed and Sealed this

Twenty-fifth Day of June 1985

[SEAL]

Attest:

DONALD J. QUIGG

Attesting Officer    Acting Commissioner of Patents and Trademarks